United States Patent
Jeong et al.

(10) Patent No.: US 9,647,047 B2
(45) Date of Patent: May 9, 2017

(54) ORGANIC LIGHT EMITTING DISPLAY FOR INITIALIZING PIXELS

(71) Applicants: Samsung Display Co., Ltd., Gyeonggi-do (KR); Industry-University Cooperation Foundation Hanyang University, Seoul (KR)

(72) Inventors: Jin-Tae Jeong, Yongin (KR); Oh-Kyong Kwon, Yongin (KR)

(73) Assignees: SAMSUNG DISPLAY CO., LTD., Yongin, Gyeonggi-Do (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 85 days.

(21) Appl. No.: 14/230,587

(22) Filed: Mar. 31, 2014

(65) Prior Publication Data
US 2014/0347347 A1 Nov. 27, 2014

(30) Foreign Application Priority Data
May 22, 2013 (KR) ........................ 10-2013-0057871

(51) Int. Cl.
G09G 3/32 (2016.01)
H01L 27/32 (2006.01)
G09G 3/3233 (2016.01)
G09G 3/3208 (2016.01)
G09G 5/18 (2006.01)

(52) U.S. Cl.
CPC ....... H01L 27/3262 (2013.01); G09G 3/3208 (2013.01); G09G 3/3233 (2013.01); G09G 5/18 (2013.01); H01L 27/3265 (2013.01); G09G 2300/0819 (2013.01); G09G 2300/0852 (2013.01); G09G 2300/0861 (2013.01); G09G 2320/045 (2013.01)

(58) Field of Classification Search
CPC ..... G09G 3/3208; G09G 3/3241; G09G 3/325
USPC .......................................... 345/82
See application file for complete search history.

(56) References Cited

U.S. PATENT DOCUMENTS

2008/0169754 A1 7/2008 Yang et al.
2009/0109150 A1* 4/2009 Han et al. ........................ 345/82
(Continued)

FOREIGN PATENT DOCUMENTS

CN 102593151 A 7/2012
KR 10-2008-0080754 A 9/2008
KR 10-2009-0131042 12/2009

*Primary Examiner* — Long D Pham
(74) *Attorney, Agent, or Firm* — Lee & Morse P.C.

(57) ABSTRACT

A pixel includes an organic light emitting diode and a pixel control circuit. The pixel control circuit includes a first transistor, a second transistor, and a third transistor. The first transistor controls an amount of current to the organic light emitting diode from a first power source based on a voltage applied to a first node. The second transistor is coupled between the first node and a data line and turns on when a scan signal is supplied to a scan line. The third transistor is coupled between the first power source and a second node that is a common terminal of first and second capacitors, which are coupled in series between the first node and the first power source. In operation, the third transistor turns on when a first control signal is supplied to a first control line.

18 Claims, 15 Drawing Sheets

(56) References Cited

U.S. PATENT DOCUMENTS

| | | |
|---|---|---|
| 2009/0309516 A1 | 12/2009 | Kim |
| 2010/0309187 A1* | 12/2010 | Kang et al. .................. 345/211 |
| 2011/0227903 A1 | 9/2011 | Choi |
| 2012/0019498 A1 | 1/2012 | Jeong |
| 2012/0113077 A1* | 5/2012 | Kang .................... G09G 3/003 |
| | | 345/211 |
| 2013/0043802 A1 | 2/2013 | Han et al. |
| 2013/0169611 A1 | 7/2013 | Chang et al. |

\* cited by examiner

ORGANIC LIGHT EMITTING DISPLAY FOR INITIALIZING PIXELS

CROSS-REFERENCE TO RELATED APPLICATION

Korean Patent Application No. 10-2013-0057871, filed on May 22, 2013, in the Korean Intellectual Property Office, and entitled "Pixel and Organic Light Emitting Display Using the Same," is incorporated by reference herein in its entirety.

BACKGROUND

1. Field

One or more embodiments described herein relate to a display device.

2. Description of the Related Art

Various types of flat panel displays have been developed. Examples include liquid crystal displays, field emission displays, plasma display panels, and organic light emitting displays. These displays are preferred by consumers because of their reduced weight and size compared with displays that use cathode ray tubes.

An organic light emitting display generates images using pixels that include organic light emitting diodes. Each diode emits light based on a recombination of electrons and holes in an active layer. Displays of this type have a fast response speed and may be driven with low power compared to other displays.

SUMMARY

In accordance with one embodiment, a pixel includes an organic light emitting diode; a first transistor configured to control an amount of current supplied to the organic light emitting diode from a first power source, the first power source coupled to a first electrode of the first transistor, the amount of current supplied to the organic light emitting diode being based on a voltage applied to a first node; a second transistor coupled between the first node and a data line, the second transistor being turned on when a scan signal is supplied to a scan line; first and second capacitors coupled in series between the first node and the first power source; and a third transistor coupled between the first power source and a second node that is a common terminal of the first and second capacitors, the third transistor being turned on when a first control signal is supplied to a first control line.

Also, the pixel may include a fourth transistor may be coupled between an anode electrode of the organic light emitting diode and an initialization power source, and the fourth transistor may turn on when the scan signal is supplied to the scan line.

Also, the initialization power source may be set to a voltage at which the organic light emitting diode is turned off.

Also, the pixel may include a fourth transistor coupled between the second node and the first electrode of the first transistor, and the fourth transistor may turn on when a second control signal is supplied to a second control line.

Also, the third transistor and a fifth transistor may be progressively turned on after a data signal is supplied to the first node. The third and a fifth transistor may have turn-on periods that partially overlap a turn-on period of the second transistor.

Also, a fourth transistor may be coupled between a second electrode of the first transistor and the organic light emitting diode, and the fourth transistor may be turned on when a second control signal is supplied to a second control line.

Also, the third transistor and a fifth transistor may be progressively turned on after a data signal is supplied to the first node. The third transistor and a fifth transistor may have turn-on periods which partially overlap a turn-on period of the second transistor.

In accordance with another embodiment, an organic light emitting display includes pixels positioned in an area defined by scan lines and data lines; a scan driver configured to simultaneously supply a scan signal to the scan lines during first and second periods in one frame, and progressively control the supply of the scan signal to the scan lines during a third period in the one frame; a data driver configured to supply a data signal to the data lines synchronized with the scan signal during the third period; and a control driver configured to supply a first control signal to a first control line commonly coupled to the pixels, and to supply a second control signal to a second control line commonly coupled to the pixels.

Each pixel positioned on an i-th (i is a natural number) horizontal line may include an organic light emitting diode; a first transistor configured to control an amount of current supplied to the organic light emitting diode from a first power source, the first power source coupled to a first electrode of the first transistor, the amount of current supplied to the organic light emitting diode being based on a voltage applied to a first node; a second transistor coupled between the first node and a data line, the second transistor being turned on when a scan signal is supplied to an i-th scan line; first and second capacitors coupled in series between the first node and the first power source; a third transistor coupled between an anode electrode of the organic light emitting diode and an initialization power source, the third transistor being turned on when the scan signal is supplied to the i-th scan line; and a fourth transistor coupled between the first power source and a second node that is a common terminal of the first and second capacitors, the fourth transistor being turned on when the first control signal is supplied to the first control line.

Also, a fifth transistor may be coupled between the second node and the first electrode of the first transistor, and the fifth transistor may be turned on when the second control signal is supplied to the second control line.

Also, a fifth transistor may be coupled between a second electrode of the first transistor and the organic light emitting diode, and the fifth transistor may be turned on when the second control signal is supplied to the second control line.

Also, the initialization power source may be set to a voltage at which the organic light emitting diode is turned off.

Also, the control driver may supply the first control signal during a first period and supplies the second control signal during a second period.

Also, the data driver may apply the voltage of a reference power source to the data lines during the first and second periods. The reference power source may be set to a voltage at which the first transistor is turned on.

Also, the data driver may apply the voltage of an off-power source to the data lines during a portion of the first period, and may apply the voltage of the reference power source to the data lines during the other of the first period and the second period.

Also, the off-power source may be set to a voltage to turn off the first transistor, and the reference power source may be set to a voltage to turn on the first transistor.

Also, the off-power source may be set to a voltage substantially equal to a voltage of the first power source, and the reference power source may be set to a voltage in the voltage range of the data signal.

Also, the control driver may supply the first control signal and then may supply the second control signal after a third period in the one frame. The scan driver may progressively stop the supply of the scan signal to the scan lines during the third period.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
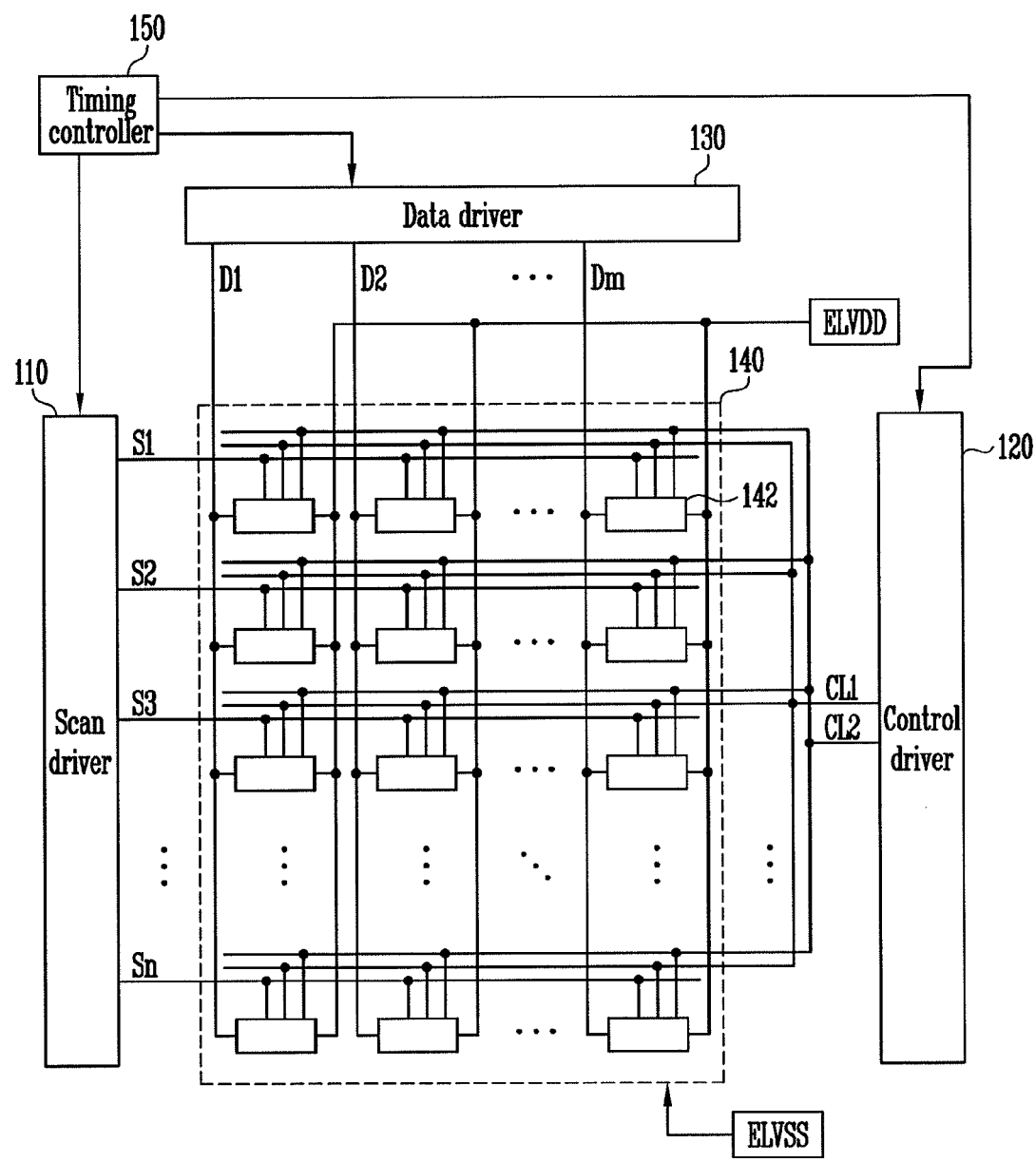
FIG. 1 illustrates an embodiment of an organic light emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it may be the only layer between the two layers, or one or more intervening layers may also be present. Like reference numerals refer to like elements throughout.

FIG. 1 illustrates an embodiment of an organic light emitting display which includes a pixel unit 140, a scan driver 110, a control driver 120, a data driver 130, and a timing controller 150. The pixel unit 140 includes pixels 142 positioned at intersection portions of scan lines S1 to Sn and data lines D1 to Dm. The scan driver 110 drives the scan lines S1 to Sn. The control driver 120 drives first and second control lines CL1 and CL2 which are commonly coupled to the pixels 142. The data driver 130 drives the data lines D1 to Dm. The timing controller 150 controls the drivers 110, 120 and 130.

The scan driver 110 may supply a scan signal to the scan lines S1 to Sn. For example, the scan driver 110 may progressively supply a scan signal to the scan lines S1 to Sn during a third period in one frame. If the scan signal is progressively supplied to the scan lines S1 to Sn, pixels 142 are selected for each horizontal line.

The data driver 130 may supply a data signal to the data lines D1 to Dm so as to be synchronized with the scan signal. Then, the data signal is supplied to the pixels 142 selected by the scan signal. The data driver 130 applies a predetermined voltage to the data lines D1 to Dm during the other periods except the third period in the one frame.

The control driver 130 supplies a first control signal to the first control line CL1 commonly coupled to the pixels 142, and supplies a second control signal to the second control line CL2 commonly coupled to the pixels 142. In accordance with one embodiment, the first and second control signals may be supplied during first and second periods, except a third period (to be discussed in greater detail below) in one frame.

The pixels 142 may be positioned in an area defined by the scan lines S1 to Sn and the data lines D1 to Dm. The pixels 142 may emit light with a predetermined luminance, by controlling the amount of current flowing from a first power source ELVDD to a second power source ELVSS via an organic light emitting diode, corresponding to the data signal.

Although the first and second control lines CL1 and CL2 were described above as being driven by the control driver 120, the first and second control lines CL1 and CL2 may be driven by the scan driver 110 in other embodiments.

In addition, although the first and second control lines CL1 and CL2 were described above as being commonly coupled to all the pixels 142, the pixel unit 140 may be divided into predetermined blocks in other embodiments. In these other embodiments, pixels 142 for each block may be coupled to different first and second control lines CL1 and CL2. In this case, the pixels 142 are driven for each block.

Figure 2:
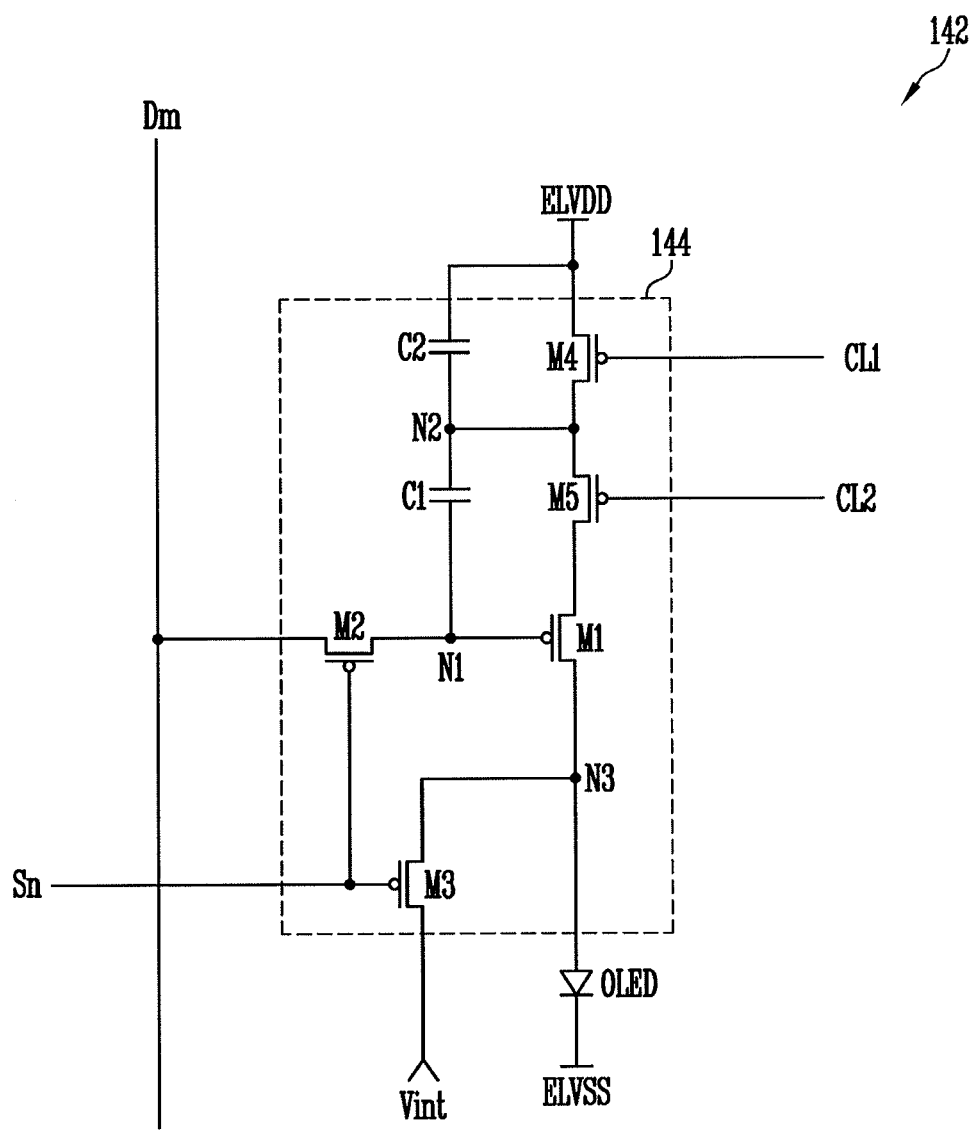
FIG. 2 illustrates a first embodiment of a pixel in FIG. 1.

FIG. 2 illustrates a first embodiment of a pixel 142 in FIG. 1. For convenience of illustration, the pixel is shown to be coupled to an n-th scan line Sn and an m-th data line Dm. Referring to FIG. 2, in the first embodiment the pixel 142 includes an organic light emitting diode OLED and a pixel circuit 144 configured to control the amount of current supplied to the organic light emitting diode OLED.

An anode electrode of the organic light emitting diode OLED may be coupled to the pixel circuit 144, and a cathode electrode of the organic light emitting diode OLED is coupled to the second power source ELVSS. The organic light emitting diode OLED may generate light with a predetermined luminance corresponding to the amount of current supplied from the pixel circuit 144. The second power source ELVSS may be set to a voltage lower than that of the first power source ELVDD, so that current may flow through the organic light emitting diode OLED.

The pixel circuit 144 may control the amount of current supplied to the organic light emitting diode OLED, corresponding to a data signal. In accordance with the first embodiment, the pixel circuit 144 includes first to fifth transistors M1 to M5, a first capacitor C1, and a second capacitor C2. While these transistors are shown as PMOS transistors, one or more of the transistors may be NMOS transistors in other embodiments.

A first electrode of the first transistor (driving transistor) M1 is coupled to a second electrode of the fifth transistor M5, and a second electrode of the first transistor M1 is coupled to a third node N3. A gate electrode of the first transistor M1 may be coupled to a first node N1. The first transistor M1 may control the amount of current flowing from the first power source ELVDD to the second power source ELVSS via the organic light emitting diode OLED, corresponding to a voltage applied to the first node N1.

A first electrode of the second transistor M2 is coupled to the data line Dm, and a second electrode of the second transistor M2 is coupled to the first node N1. A gate electrode of the second transistor M2 is coupled to the scan line Sn. The second transistor M2 is turned on when a scan signal is supplied to the scan line Sn, so as to allow the data line Dm and the first node N1 to be electrically coupled to each other.

A first electrode of the third transistor M3 may be coupled to the third node N3, and a second electrode of the third transistor M3 may be coupled to an initialization power source Vint. A gate electrode of the third transistor M3 is coupled to the scan line Sn. The third transistor M3 is turned on when the scan signal is supplied to the scan line Sn, so as to apply the voltage of the initialization power source Vint to the third node N3. The initialization power source Vint may be set to a low voltage, so that the organic light emitting diode OLED may be turned off.

A first electrode of the fourth transistor M4 may be coupled to the first power source ELVDD, and a second electrode of the fourth transistor M4 is coupled to a second node N2. A gate electrode of the fourth transistor M4 may be coupled to the first control line CL1. The fourth transistor M4 is turned on when a first control signal is supplied to the first control line CL1, so as to supply the voltage of the first power source ELVDD to the second node N2.

A first electrode of the fifth transistor M5 may be coupled to the second node N2, and the second electrode of the fifth transistor M5 may be coupled to the first electrode of the first transistor M1. A gate electrode of the fifth transistor M5 is coupled to the second control line CL2. The fifth transistor M5 is turned on when a second control signal is supplied to the second control line CL2, so as to allow the second node N2 and the first transistor M1 to be electrically coupled to each other.

The first capacitor C1 may be coupled between the first and second nodes N1 and N2. The first capacitor C1 may store the threshold voltage of the first transistor M1 and a voltage corresponding to the data signal.

The second capacitor C2 may be coupled between the second node N2 and the first power source ELVDD. The second capacitor C2 may have a predetermined capacitance, so as to allow for storage of the threshold voltage of the first transistor M1 and the voltage corresponding to the data signal.

Figure 3:
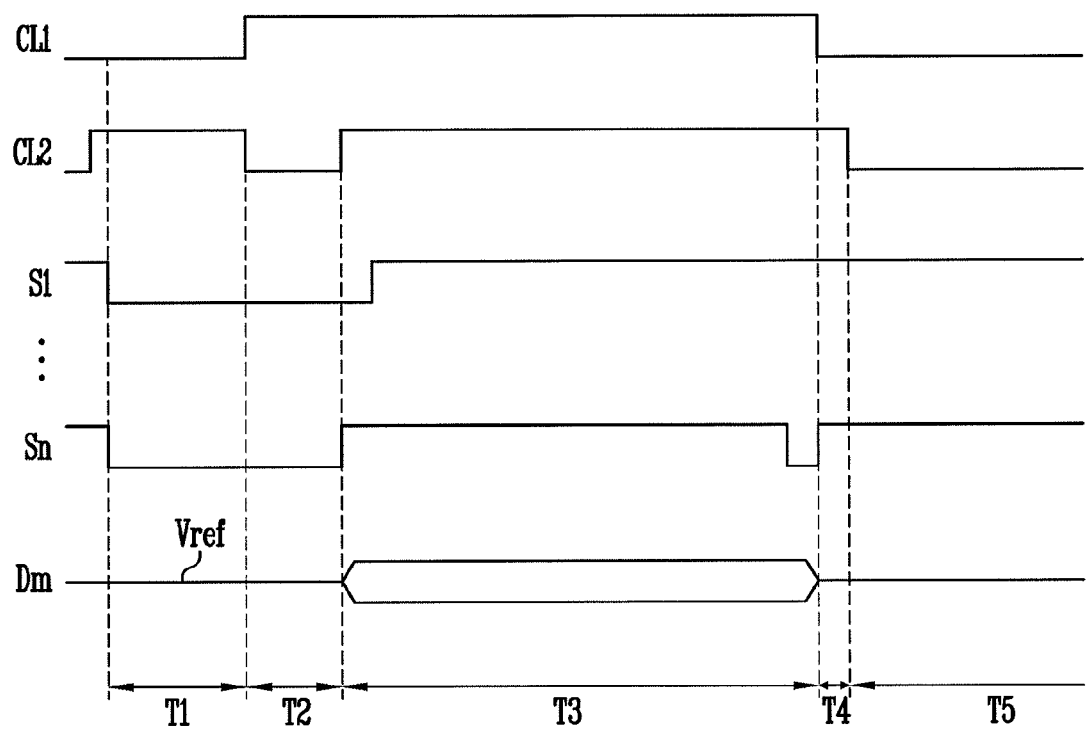
FIG. 3 illustrates a waveform corresponding to a first embodiment of a method for driving the pixel in FIG. 2.

FIG. 3 illustrates a waveform corresponding to a first embodiment of a method for driving the pixel in FIG. 2. Referring to FIG. 3, during a first period T1, a first control signal is supplied to the first control line CL1, a scan signal is supplied to the scan lines S1 to Sn, and the voltage of a reference power source Vref is applied to the data line Dm. The reference power source Vref is set to a specific voltage in the voltage range of the data signal. Thus, the reference power source Vref may be set to a voltage at which current may flow through the first transistor M1.

Figure 4A:
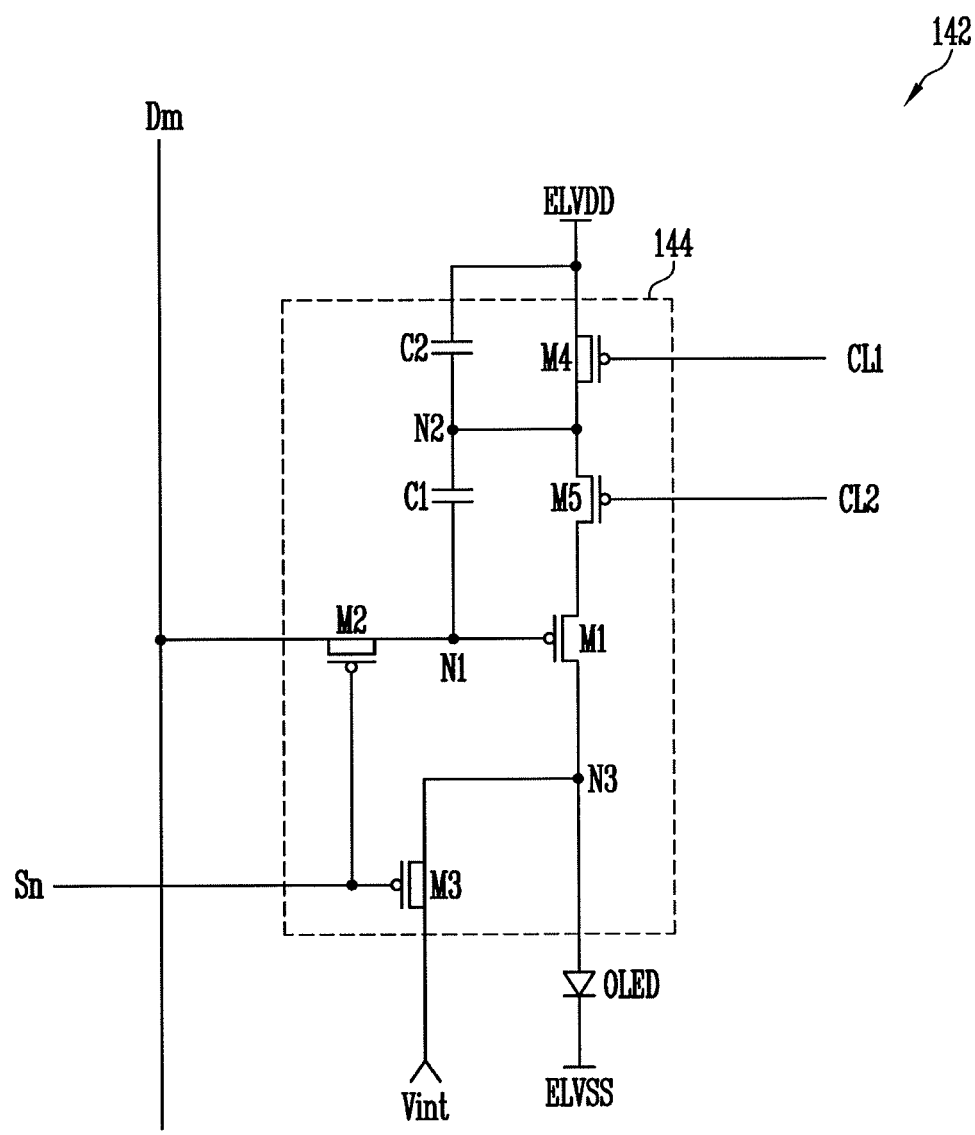
FIGS. 4A-4C illustrate an embodiment of a process for operating the pixel based on the driving waveform of FIG. 3.
Figure 4B:
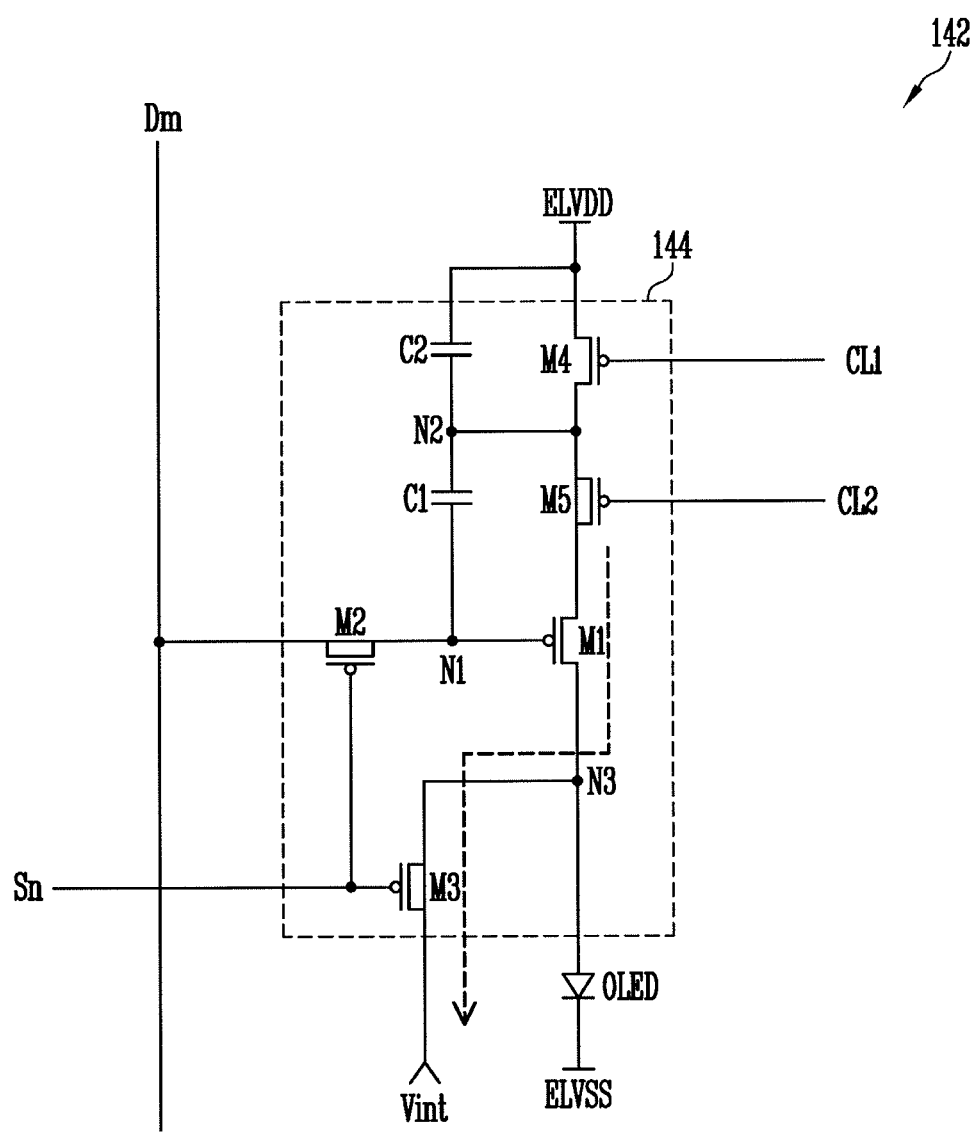

When the first control signal is supplied to the first control line CL1, the fourth transistor M4 is turned on as shown in FIG. 4A. When the fourth transistor M4 is turned on, the voltage of the first power source ELVDD is applied to the second node N2.

When the scan signal is supplied to the scan line Sn, the second and third transistors M2 and M3 are turned on. When the second transistor M2 is turned on, the voltage of the reference power source Vref from the data line Dm is applied to the first node N1.

When the third transistor M3 is turned on, the voltage of the initialization power source Vint is applied to the third node N3. When the voltage of the initialization power source Vint is applied to the third node N3, the organic light emitting diode OLED is initialized. For example, if the voltage of the initialization power source Vref is applied to the third node N3, an organic capacitor parasitically formed in the organic light emitting diode OLED may be discharged to be initialized.

During a second period T2, a second control signal may be supplied to the second control line CL2, the scan signal may be supplied to the scan lines S1 to Sn, and the voltage of the reference power source Vref may be applied to the data line Dm. When the second control signal is supplied to the second control line CL2, the fifth transistor M5 is turned on. When the fifth transistor M5 is turned on, the second node and the first electrode of the first transistor M1 are electrically coupled to each other.

Also, during the second period T2, the voltage of the reference power source Vref may be supplied to the first node N1 and the third transistor M3 may maintain a turn-on state. As a result, a predetermined current flows from the second node N2 to the initialization power source Vint via the fifth, first, and third transistors M5, M1 and M3.

When this occurs, the voltage at the second node N2 may be dropped from the voltage of the first power source ELVDD to a voltage obtained by adding the threshold voltage of the first transistor M1 to the voltage of the reference power source Vref. When the voltage at the second node N2 is set as the voltage obtained by adding the threshold voltage of the first transistor M1 to the voltage of the reference power source Vref, the first transistor M1 is turned off. Then, a voltage corresponding to the threshold voltage of the first transistor M1 may be charged in the first capacitor C1.

Figure 4C:
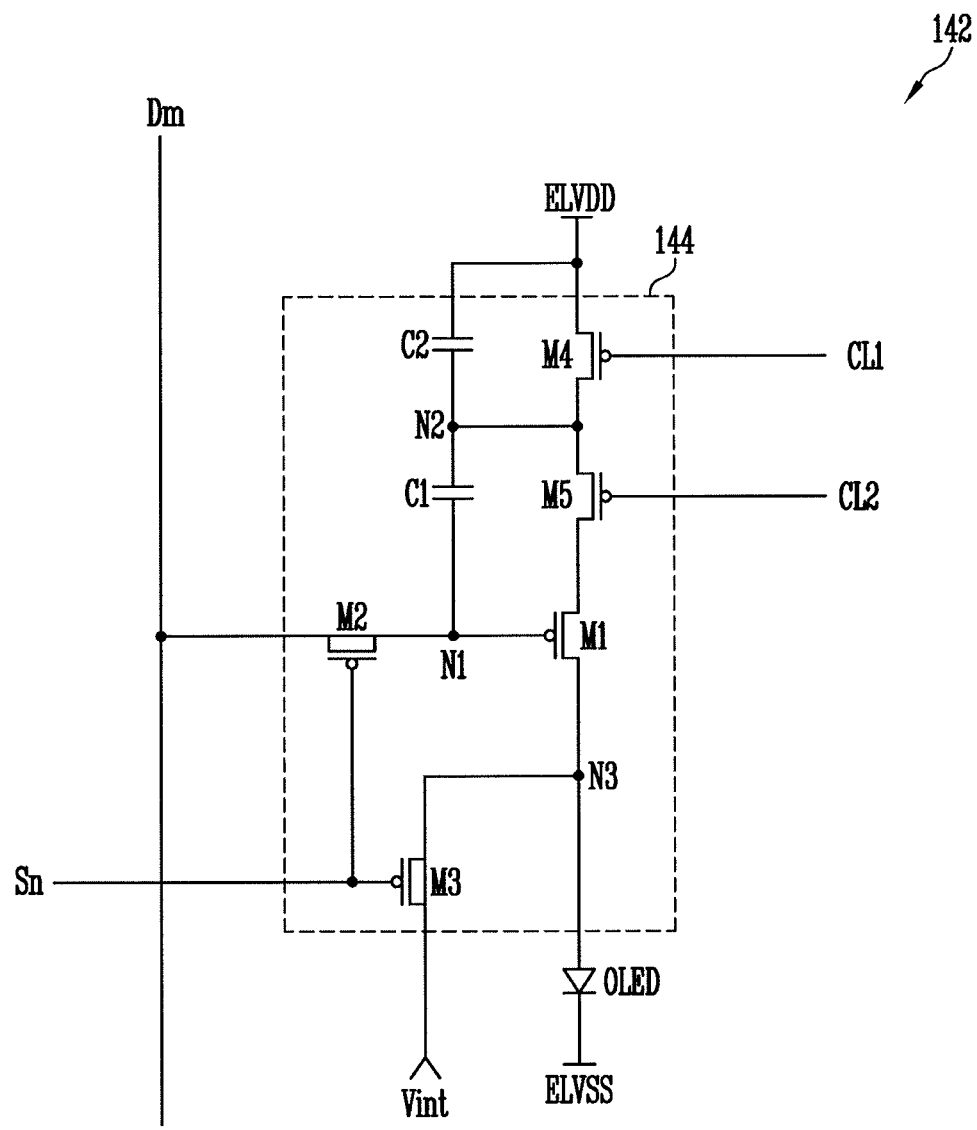

During a third period T3, a scan signal may be progressively supplied to the scan lines S1 to Sn, and a data signal may be supplied to the data lines D1 to Dm synchronized with the scan signal. When the scan signal is supplied to the n-th scan line Sn, the second and third transistors M2 and M3 are turned on as shown in FIG. 4C. When the second transistor M2 is turned on, the data signal from the data line Dm is supplied to the first node N1.

When the data signal is supplied to the first node N1, the voltage at the first node N1 is changed from the voltage of the reference power source Vref to the voltage of the data signal. Then, the voltage at the second node N2 may also be changed corresponding to the change in the voltage at the first node N1. Practically, the voltage at the second node N2 may be changed into a predetermined voltage, corresponding to a ratio of the capacitances of the first and second capacitors C1 and C2. Then, the threshold voltage of the first transistor M1 and a voltage corresponding to the data signal are charged in the first capacitor C1.

After the threshold voltage of the first transistor M1 and the voltage corresponding to the data signal are charged in the first capacitor C1, the first control signal is supplied to the first control line CL1 during a fourth period T4, so that the fourth transistor M4 is turned on. When the fourth transistor M4 is turned on, the voltage of the first power source ELVDD is applied to the second node N2. In this case, the first node N1 is set in a floating state, and hence the first capacitor C1 stably maintains the voltage charged in the previous period.

Subsequently, the second control signal may be supplied to the second control lien CL2 during a fifth period T5 so that the fifth transistor M5 is turned on. If the fifth transistor M is turned on, the first electrode of the first transistor M1 is electrically coupled to the first power source ELVDD via the first node N1. Then, the first transistor M1 may control the amount of current supplied to the organic light emitting diode OLED, corresponding to the voltage stored in the first capacitor C1.

An organic light emitting display may display an image with a predetermined luminance by repeating the aforementioned procedure for the pixels in the pixel unit. In the first embodiment, the threshold voltages of the pixels may be simultaneously compensated during the second period T2. In this case, the second period T2 may be sufficiently assigned and, accordingly, the threshold voltage of the first transistor M1 may be stably compensated even when the organic light emitting display is driven at a high speed of 120 Hz or more.

Figure 5:
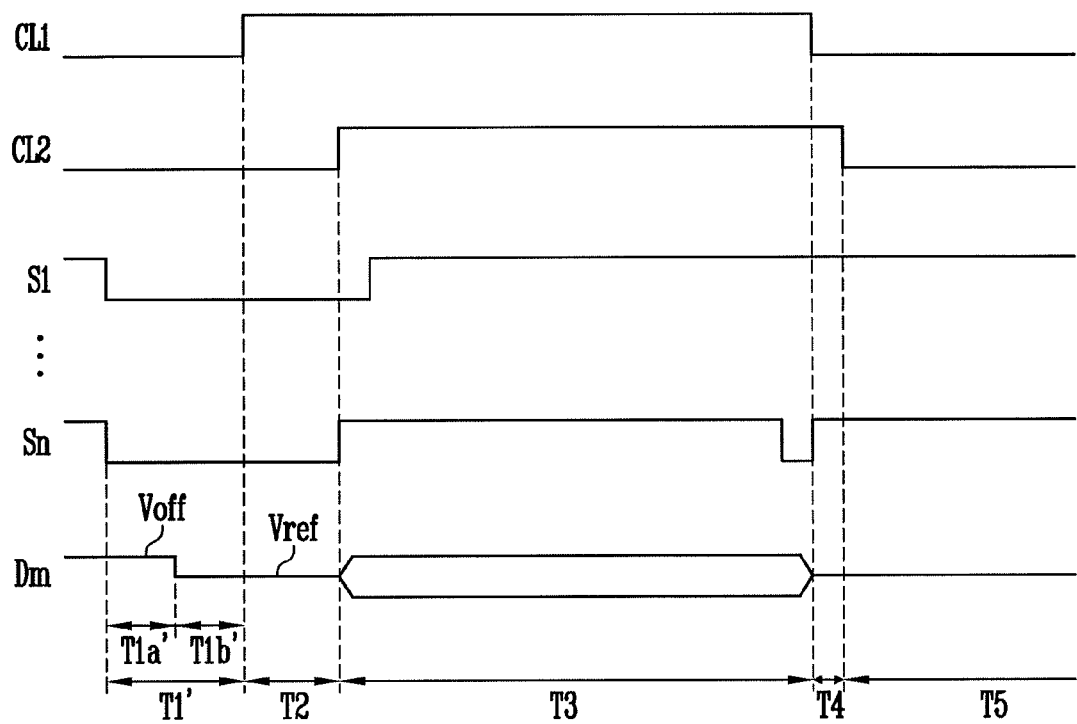
FIG. 5 illustrates a waveform corresponding to a second embodiment of a method for driving the pixel in FIG. 2.

FIG. 5 illustrates another waveform corresponding to a second embodiment of a method for driving the pixel in FIG. 2. Referring to FIG. 5, during a first period T1', a first control signal is supplied to the first control line CL1, a second control signal is supplied to the second control line CL2, and a scan signal is supplied to the scan lines S1 to Sn. The voltage of an off-power source Voff is applied to the data line Dm during a first portion T1a' of the first period T1', and the voltage of a reference power source Vref is applied to the data line Dm during a second portion T1b' of the first period T1'.

Figure 6A:
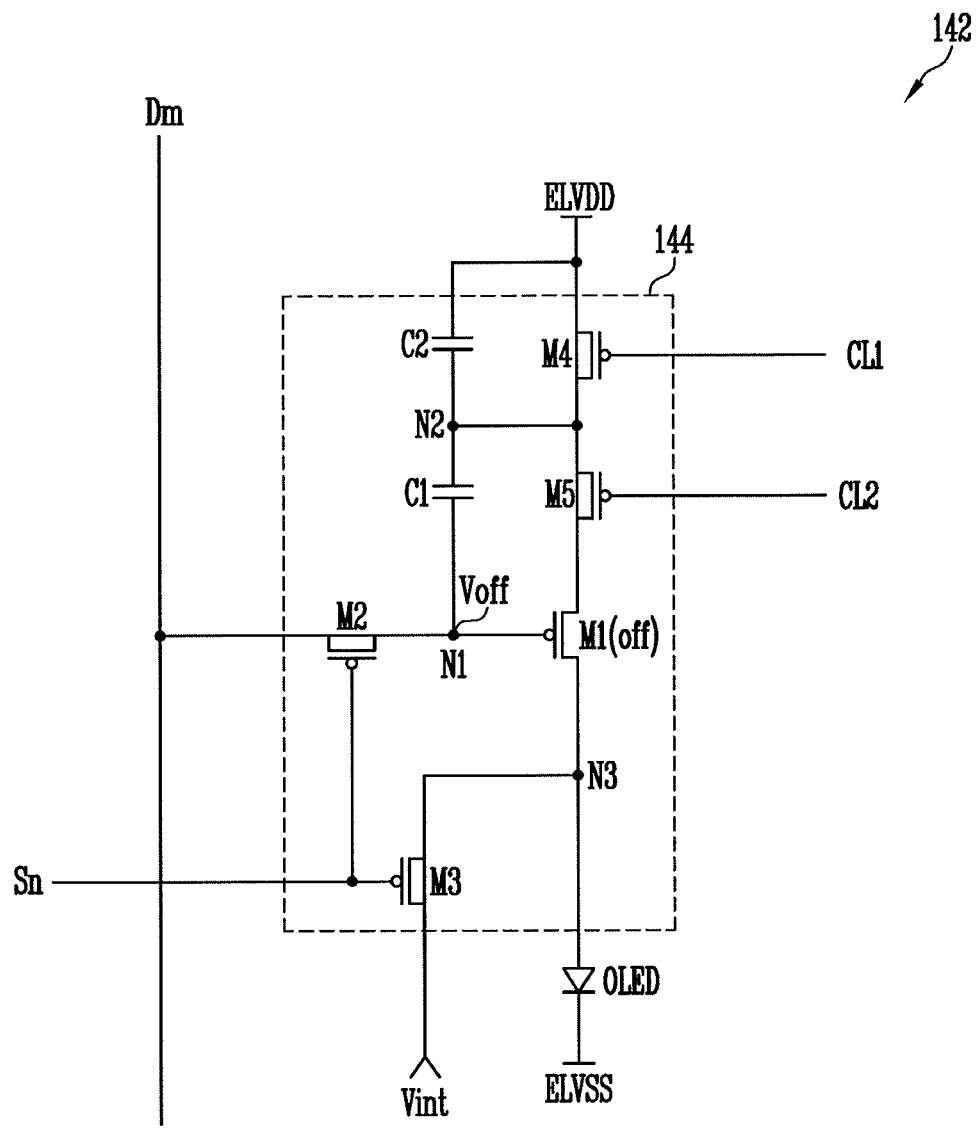
FIGS. 6A-6B illustrate an embodiment of a process for operating the pixel based on the driving waveform of FIG. 5.

When the first control signal is supplied to the first control line CL1, the fourth transistor M4 is turned on so that the first power source ELVDD and the second node N2 are electrically coupled to each other, as shown in FIG. 6A. When the second control signal is supplied to the second control line CL2, the fifth transistor M5 is turned on so that the first electrode of the first transistor M1 and the second node N2 is electrically coupled to each other.

When the scan signal is supplied to the scan line Sn, the second and third transistors M2 and M3 are turned on. When the second transistor M2 is turned on, the voltage of the off-power source Voff from the data line Dm is applied to the first node N1. When the voltage of the off-power source Voff is applied to the first node N1 during the T1a' portion of period T1', the first transistor M1 is turned off. The off-power source Voff may be set to a voltage at which the first transistor M1 may be turned off, which, for example, may be a voltage identical to that of the first power source ELVDD or another voltage.

When the first transistor M1 is turned off, unnecessary current may be prevented from being supplied to the initialization power source Vint, even through the fourth and fifth transistors M4 and M5 are turned on. Accordingly, it may be possible to reduce power consumption and help secure operational reliability.

When the third transistor M3 is turned on, the voltage of the initialization power source Vint is applied to the third node N3. When the voltage of the initialization power source Vint is applied to the third node N3, the organic light emitting diode OLED is initialized.

Figure 6B:
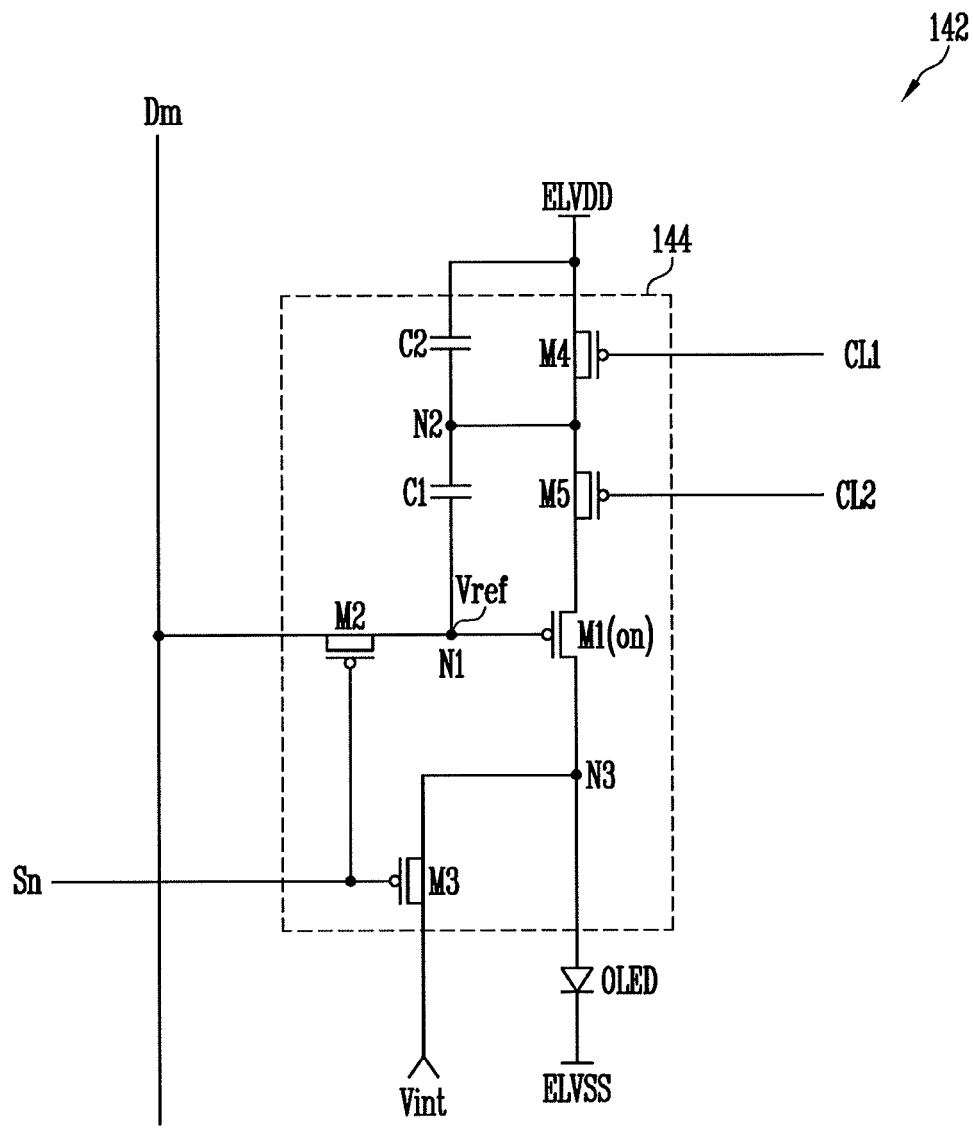

Subsequently, the voltage of the reference power source Vref may be applied to the data line Dm during the second period T1b' of the first period T1'. When the voltage of the reference power source Vref is applied to the data line Dm, the first transistor M1 is set in a turn-on state as shown in FIG. 6B. In this case, an on-bias voltage is applied to the first transistor M1 during the second portion T1b' of the first period T1'. Accordingly, it may be possible to display an image with uniform luminance.

Specifically, the voltage characteristic of the first transistor M1 included in each pixel 142 may be set unequally, for example, based on a gray scale value of the previous period. Therefore, an image with a desired luminance may not be displayed.

In accordance with one embodiment, the voltage characteristic of the first transistor M1 is initialized by applying the on-bias voltage to the first transistor M1 during the second period T1b' of period T1'. Accordingly, it may be possible for a uniform image to be generated. Also, the current flowing through the first transistor M1 may be supplied to the initialization power source Vint during the second portion T1b' of the first period T1'. Accordingly, the organic light emitting diode OLED may be maintained in a non-emission state. In this embodiment, operations of the pixel during the second to fifth periods T2 to T5 may be similar to those in FIG. 3.

Figure 7:
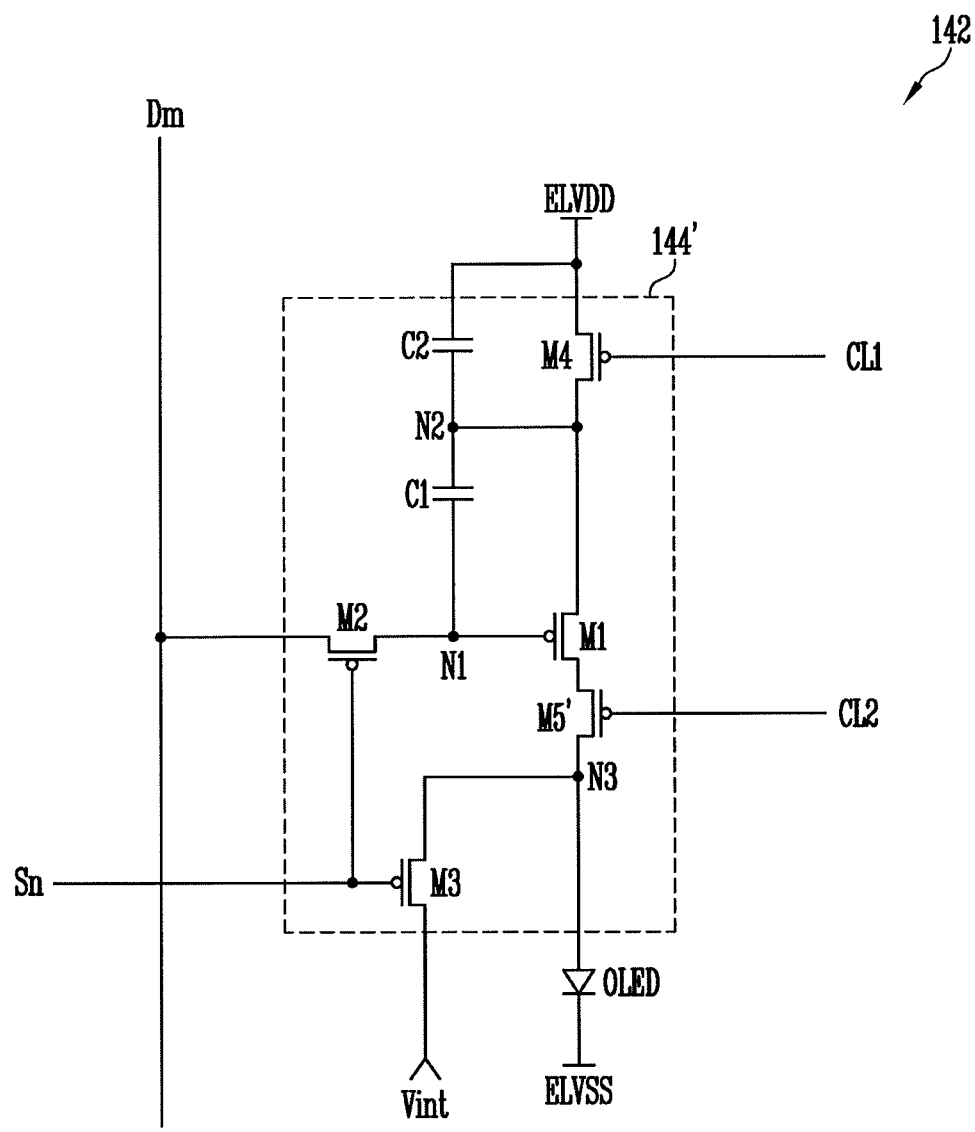
FIG. 7 illustrates a second embodiment of the pixel in FIG. 1.

FIG. 7 illustrates a second embodiment of a pixel in FIG. 1. Referring to FIG. 7, the pixel 142 according to this embodiment includes a pixel circuit 144' and an organic light emitting diode OLED.

The pixel circuit 144' may include a fifth transistor M5' coupled between the second electrode and the third node N3. The fifth transistor M5' may be turned on when a second control signal is supplied to the second control line CL2 so as to allow the first transistor M1 and the third node N3 to be electrically coupled to each other. The pixel 142 may therefore have a structure similar to that of the pixel 142 of FIG. 2, except that the position of the fifth transistor M5' is changed.

In operation, during a first period T1', a first control signal is supplied to the first control line CL1, a second control signal is supplied to the second control line CL2, and a scan signal is supplied to the scan lines S1 to Sn. The voltage of the off-power source Voff may be applied to the data line Dm during a first portion T1a' of the first period T1', and the voltage of the reference power source Vref may be applied to the data line Dm during the second portion T1b' of the first period T1'.

Figure 8A:
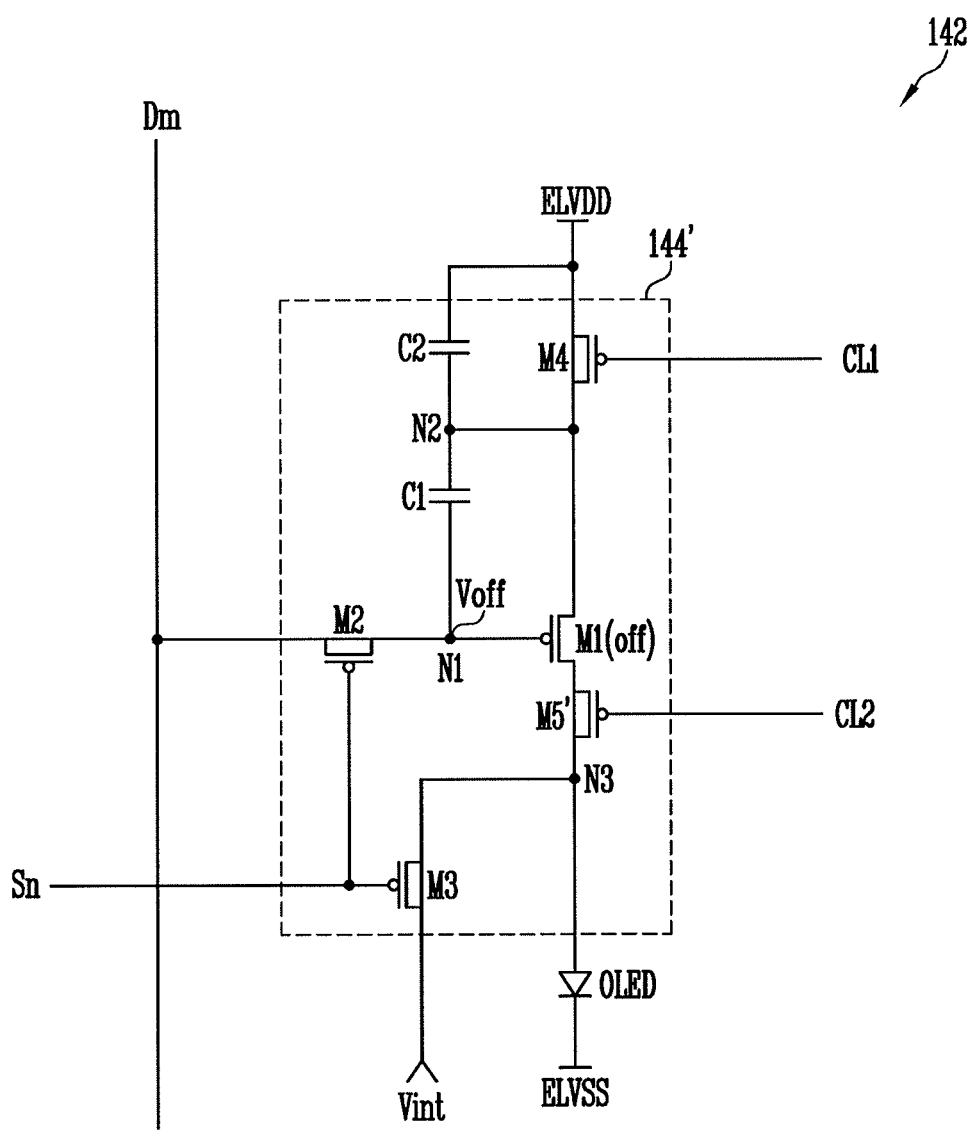
FIGS. 8A-8D illustrate another embodiment of a process for operating the pixel based on the driving waveform of FIG. 5.

When the first control signal is supplied to the first control line CL1, the fourth transistor M4 is turned on so that the first power source ELVDD is electrically coupled to the first electrode of the first transistor M1 via the second node N2 as shown in FIG. 8A. When the second control signal is supplied to the second control line CL2, the fifth transistor M5' is turned on so that the second node of the first transistor M1 is electrically coupled to the third node N3.

When the scan signal is supplied to the scan line Sn, the second and third transistors M2 and M3 are turned on. When the second transistor M2 is turned on, the voltage of the off-power source Voff from the data line Dm is applied to the first node N1. When the voltage of the off-power source Voff is applied to the first node N1, the first transistor M1 is turned off. When the third transistor M3 is turned on, the voltage of the initialization power source Vint is applied to the third node N3. When the voltage of the initialization power source Vint is applied to the third node N3, the organic light emitting diode OLED is initialized.

Figure 8B:
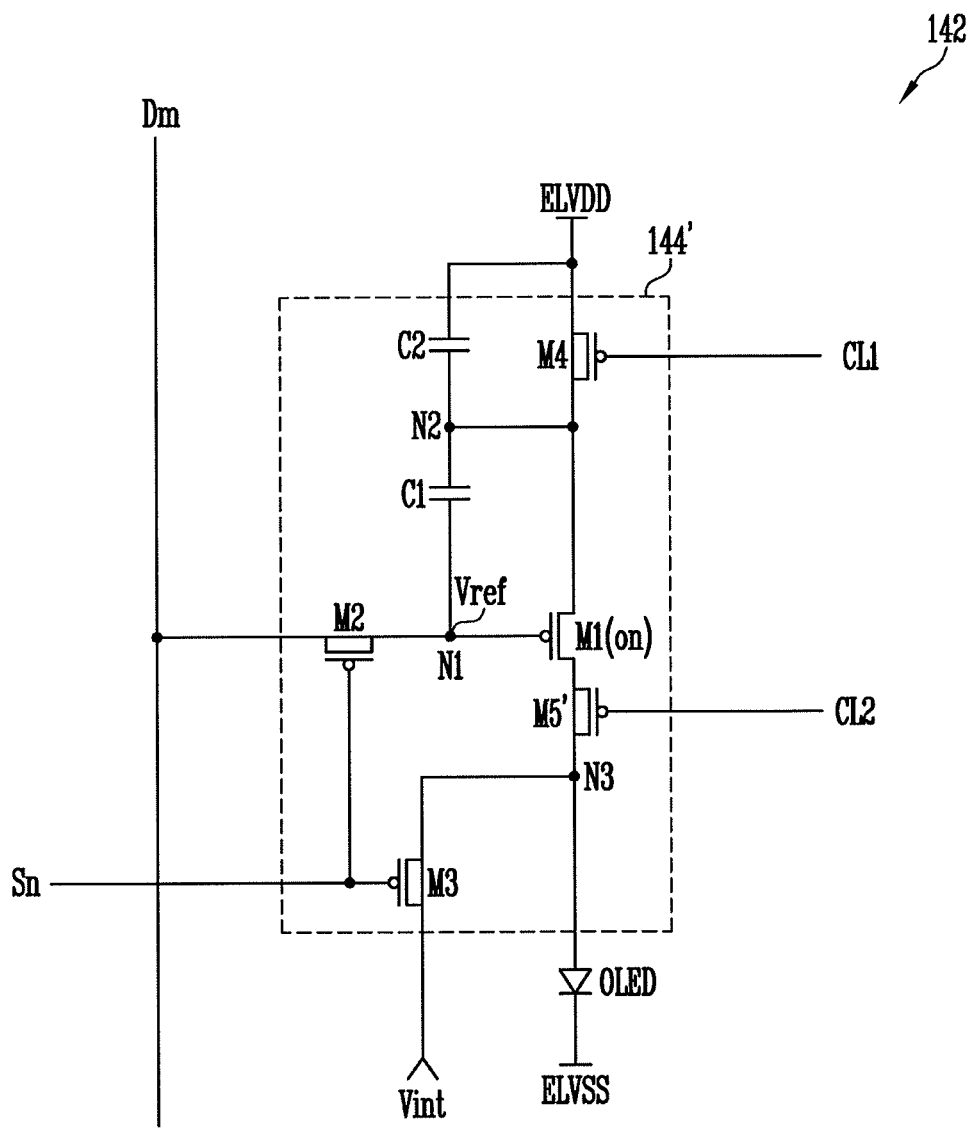

Subsequently, the voltage of the reference power source Vref is applied to the data line Dm during the second portion T1b' of the first period T1', except the portion of the first period T1'. When the voltage of the reference power source Vref is applied to the data line Dm during the second portion T1b' of period T1', the first transistor M1 is set in a turn-on state as shown in FIG. 8B. Then, an on-bias voltage is applied to the first transistor M1 during the second portion T1$b'$ of the first period T1'. Accordingly, it may be possible to display an image with uniform luminance.

Figure 8C:
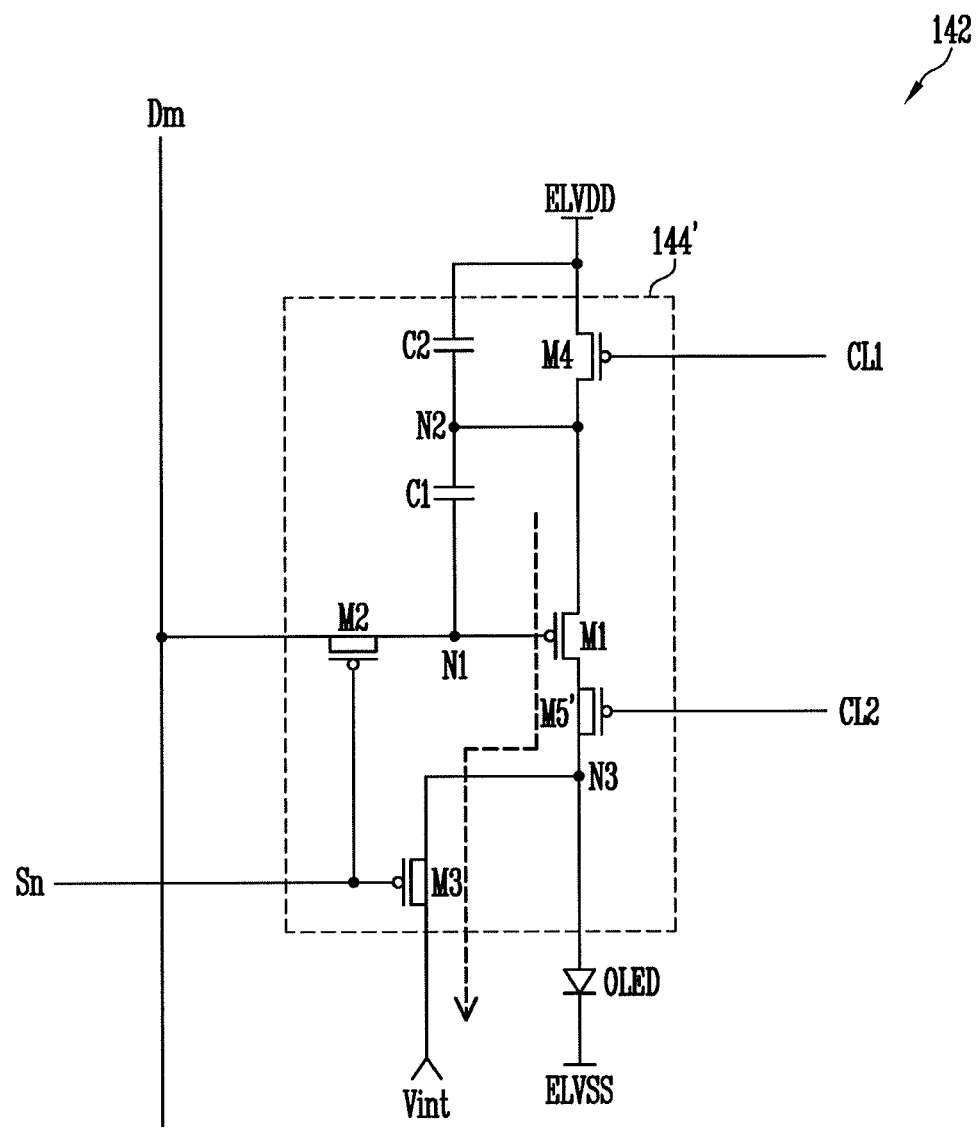

During the second period T2, the second control signal may be supplied to the second control line CL2, the scan signal may be supplied to the scan lines S1 to Sn, and the voltage of the reference power source Vref may be applied to the data line Dm. When the second control signal is supplied to the second control line CL2, the fifth transistor M5' is turned on so that the first transistor M1 and the third node N3 are electrically coupled to each other as shown in FIG. 8C.

In this case, the voltage of the reference power source Vref is applied to the first node N1, and the third transistor M3 maintains a turn-on state. Hence, a predetermined current flows from the second node N2 to the initialization power source Vref via the first, fifth and third transistors M1, M5' and M3. Then, the voltage at the second node N2 is dropped from the voltage of the first power source ELVDD to the voltage obtained by adding the threshold voltage of the first transistor M1 to the voltage of the reference power source Vref. Thus, a voltage corresponding to the threshold voltage of the first transistor M1 may be charged in the first capacitor C1 during the second period T2.

Figure 8D:
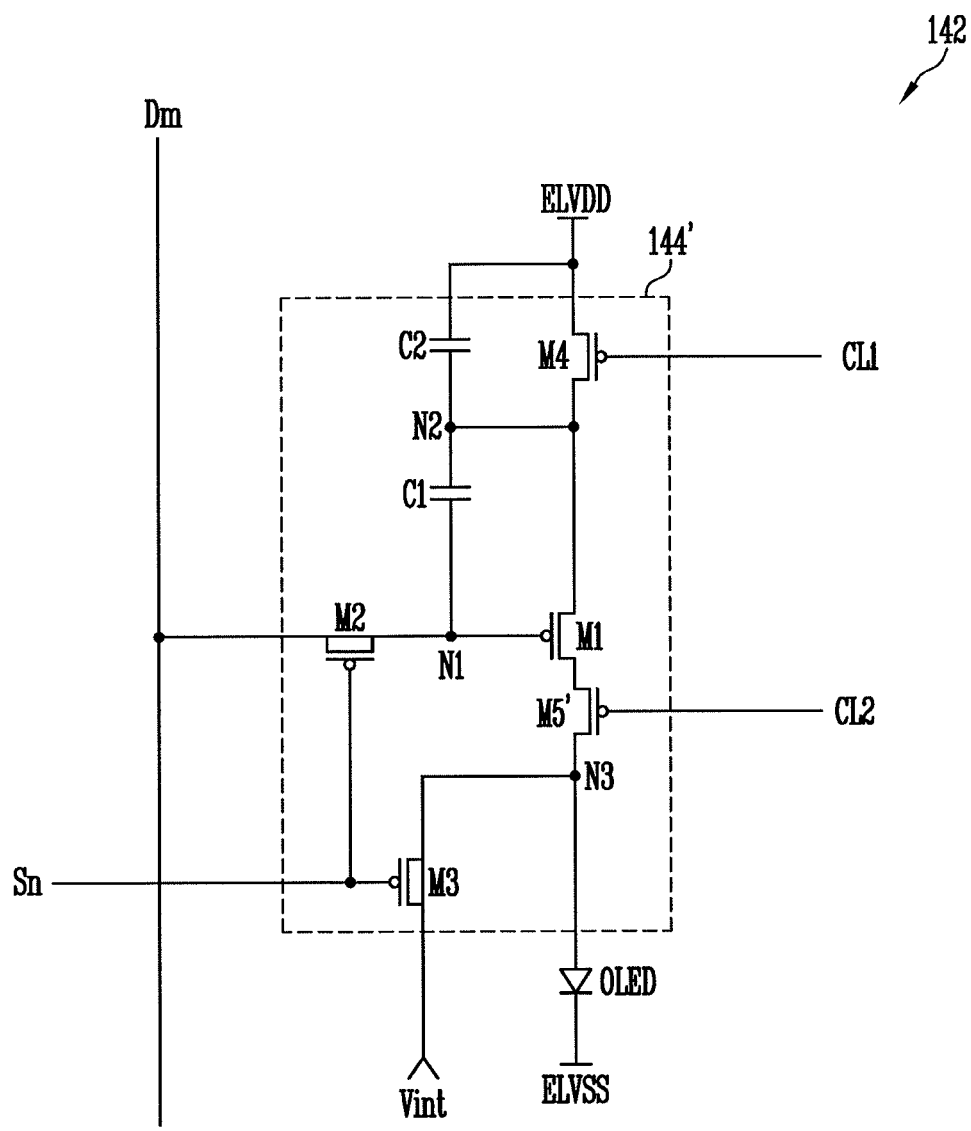

During the third period T3, a scan signal may be progressively supplied to the scan lines S1 to Sn, and a data signal may be supplied to the data lines D1 to Dm synchronized with the scan signal. When the scan signal is supplied to the n-th scan line Sn, the second and third transistors M2 and M3 are turned on as shown in FIG. 8D. When the second transistor M2 is turned on, the data signal from the data line Dm is supplied to the first node N1.

When the data signal is supplied to the first node N1, the voltage at the first node N1 is changed from the voltage of the reference power source Vref to the voltage of the data signal. Then, the voltage at the second node N2 is also changed corresponding to a change in the voltage at the first node N1. Practically, the voltage at the second node N2 is changed into a predetermined voltage, for example, based on a ratio of the capacitances of the first and second capacitors C1 and C2. Then, the threshold voltage of the first transistor M1 and a voltage corresponding to the data signal may be charged in the first capacitor C1.

After the threshold voltage of the first transistor M1 and the voltage corresponding to the data signal are charged in the first capacitor C1, the first control signal may be supplied to the first control line CL1 so that the fourth transistor M4 is turned on during the fourth period T4. If the fourth transistor M4 is turned on, the voltage of the first power source ELVDD is applied to the second node N2. In this case, the first node N1 may be set in a floating state and, hence, the first capacitor C1 may stably maintain the voltage charged in the previous period.

Subsequently, the second control signal is supplied to the second control line CL2 so that the fifth transistor M5' is turned on during the fifth period T5. When the fifth transistor M5' is turned on, the first electrode of the first transistor M1 is electrically coupled to the first power source ELVDD via the first node N1. Then, the first transistor M1 controls the amount of current supplied to the organic light emitting diode OLED, corresponding to the voltage stored in the first capacitor C1.

Figure 9:
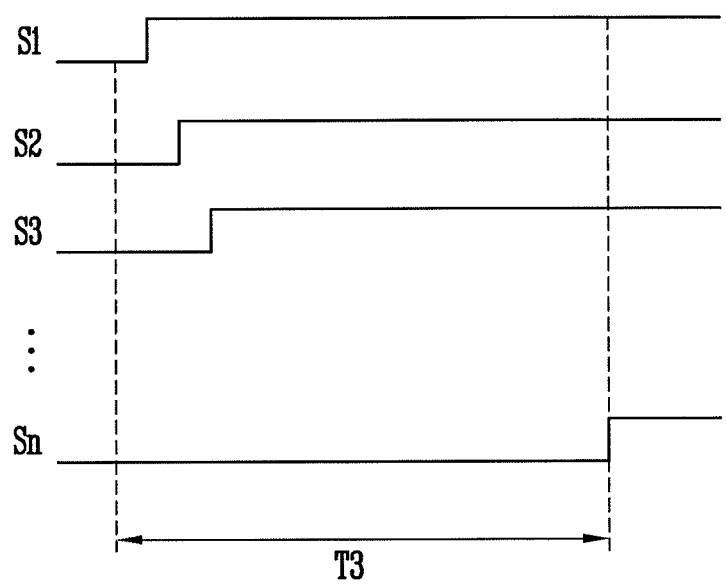
FIG. 9 illustrates an example of a waveform of a scan signal supplied during a third period of operation.

Although it has been illustrated in FIGS. 3 and 5 that a scan signal is progressively supplied to the scan lines S1 to Sn during the third period T3, the scan signal may be supplied in a different manner in the third period T3 in other embodiments. For example, in one embodiment, a scan signal may be simultaneously supplied to the scan lines S1 to Sn during the third period T3 as shown in FIG. 9. In this case, the supply of the scan signal supplied to the scan lines S1 to Sn is progressively stopped. In a case where the scan signal is simultaneously supplied to the scan lines S1 to Sn and the supply of the scan signal is progressively stopped, the scan driver 110 may be briefly configured with a shift register.

Meanwhile, a specific pixel 142 positioned on an i-th (i is a natural number) horizontal line finally charges the voltage of a data signal corresponding to the i-th horizontal line, regardless of a data signal of the previous horizontal line. After the specific pixel 142 charges the voltage of the data signal corresponding to the i-th horizontal line, the supply of the scan signal to an i-th scan line S1 may be stopped. Accordingly, the specific pixel 142 may stably maintain the voltage of a desired data signal.

Additionally, in the aforementioned embodiments, the transistors are shown as PMOS transistors. In other embodiments, the transistors in the pixel circuit may be NMOS transistors or a combination of PMOS and NMOS transistors.

Also, in accordance with one or more embodiments, an organic light emitting diode OLED may generate red, green and blue light corresponding to the amount of current supplied from the driving transistor. A combination of these OLEDs may correspond to sub-pixels emitting different color light in a pixel. In other embodiments, the organic light emitting diode OLED may generate white light corresponding to the amount of the current supplied from the driving transistor. In this case, a color image is implemented using a separate color filter or the like.

By way of summation and review, an organic light emitting display may include a plurality of pixels arranged in a matrix form at intersection portions of a plurality of data lines, a plurality of scan lines, and a plurality of power lines. Furthermore, each pixel may include an organic light emitting diode, two or more transistors including a driving transistor, and one or more capacitors.

In general, an organic light emitting display has low power consumption. However, in some cases, the amount of current flowing through the organic light emitting diode may depend on a variation in threshold voltage of the driving transistor in each pixel. This may cause display inequality. Thus, the characteristic of the driving transistor may change depending on manufacturing process variables of the driving transistor included in each pixel. The manufacturing of the organic light emitting display so that all the transistors have the same characteristic may not be practical in the current process conditions. Accordingly, there may occur a variation in threshold voltage of the driving transistor.

In view of this, there has been considered a method of adding, to each pixel, a compensation circuit, including a plurality of transistors and a capacitor, that charges a voltage corresponding to the threshold voltage of a driving transistor during one horizontal period. Accordingly, a variation in the threshold voltage of the driving transistor may be compensated.

Also, a method has been considered in which the compensation circuit is driven at a driving frequency of 120 Hz or more in order to prevent a motion blur phenomenon and/or to implement 3D images. However, in a case where the compensation circuit is driven at a high frequency of 120 Hz or more, the period required to charge the threshold voltage of the driving transistor is shortened, which may complicate compensating for the threshold voltage of the driving transistor.

In accordance with one or more embodiments of the pixel and organic light emitting display described herein, the threshold voltages of the driving transistors in the pixels may be simultaneously compensated during a specific period in one frame. Accordingly, the period required to compensate for the threshold voltage of the driving transistor may be sufficiently secured, thereby improving display quality.

Also, in accordance with one or more embodiments, an on-bias voltage may be applied to the driving transistor. Accordingly, it may be possible to display an image with uniform luminance, regardless of a gray scale of the previous period.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:
an organic light emitting diode;
a first transistor to control an amount of current supplied to the organic light emitting diode from a first power source, the amount of current supplied to the organic light emitting diode being based on a voltage applied to a first node;
a second transistor coupled between the first node and a data line, the second transistor being turned on when a scan signal is supplied to a scan line;
first and second capacitors coupled in series between the first node and the first power source; and
a third transistor coupled between the first power source and a second node that is a common terminal of the first and second capacitors, the third transistor being turned on during a first period by a first control signal supplied to a first control line; and
a fourth transistor coupled to the first transistor, the fourth transistor being turned on during the first period and a second period by a second control signal supplied to a second control line, wherein
a voltage of an off-power source is applied to the data line during a portion of the first period, and
a voltage of a reference power source is applied to the data line during the other of the first period and the second period.

2. The pixel as claimed in claim 1, further comprising:
a fifth transistor coupled between an anode electrode of the organic light emitting diode and an initialization power source, the fifth transistor being turned on when the scan signal is supplied to the scan line.

3. The pixel as claimed in claim 2, wherein the initialization power source is set to a voltage at which the organic light emitting diode is turned off.

4. The pixel as claimed in claim 1, further comprising:
the fourth transistor coupled between the second node and a first electrode of the first transistor.

5. The pixel as claimed in claim 4, wherein the third transistor and the fourth transistor are progressively turned on after a data signal is supplied to the first node.

6. The pixel as claimed in claim 4, wherein the third transistor and the fourth transistor have turn-on periods that partially overlap a turn-on period of the second transistor.

7. The pixel as claimed in claim 1, further comprising:
the fourth transistor coupled between a second electrode of the first transistor and the organic light emitting diode.

8. The pixel as claimed in claim 7, wherein the third transistor and the fourth transistor are progressively turned on after a data signal is supplied to the first node.

9. The pixel as claimed in claim 7, wherein the third transistor and the fourth transistor have turn-on periods which partially overlap a turn-on period of the second transistor.

10. An organic light emitting display, comprising:
pixels disposed on a plurality of horizontal lines and a plurality of vertical lines, each of pixels positioned in an area defined by scan lines and data lines;
a scan driver to simultaneously supply scan signals to the scan lines during first and second periods in one frame, and progressively control the supply of the scan signals to the scan lines during a third period in the one frame;
a data driver to supply data signals to the data lines synchronized with the scan signals during the third period; and
a control driver to supply a first control signal to a first control line commonly coupled to the pixels on the plurality of horizontal lines and the plurality of vertical lines, and to supply a second control signal to a second control line commonly coupled to the pixels on the plurality of horizontal lines and the plurality of vertical lines, wherein the pixels include i-th horizontal pixels positioned on an i-th (i is a natural number) horizontal line, and wherein each of the i-th horizontal pixels includes:
an organic light emitting diode;
a first transistor to control an amount of current supplied to the organic light emitting diode from a first power source, the amount of current supplied to the organic light emitting diode being based on a voltage applied to a first node;
a second transistor coupled between the first node and a data line, the second transistor being turned on when an i-th scan signal is supplied to an i-th scan line;
first and second capacitors coupled in series between the first node and the first power source;
a third transistor coupled between an anode electrode of the organic light emitting diode and an initialization power source, the third transistor being turned on when the i-th scan signal is supplied to the i-th scan line; and
a fourth transistor coupled between the first power source and a second node that is a common terminal of the first and second capacitors, the fourth transistor being turned on when the first control signal is supplied to the first control line, wherein
the control driver supplies the first control signal during the first period, and supplies the second control signal during the second period, and wherein
the data driver applies a voltage of an off-power source to the data lines during a portion of the first period, and applies a voltage of a reference power source to the data lines during the other of the first period and the second period.

11. The organic light emitting display as claimed in claim 10, further comprising a fifth transistor coupled between the second node and a first electrode of the first transistor, the fifth transistor being turned on when the second control signal is supplied to the second control line.

12. The organic light emitting display as claimed in claim 10, further comprising a fifth transistor coupled between a second electrode of the first transistor and the organic light emitting diode, the fifth transistor being turned on when the second control signal is supplied to the second control line.

13. The organic light emitting display as claimed in claim 10, wherein the initialization power source is set to a voltage at which the organic light emitting diode is turned off.

14. The organic light emitting display as claimed in claim 10, wherein the voltage of the reference power source is set such that the first transistor is turned on.

15. The organic light emitting display as claimed in claim 10, wherein the control driver supplies the second control signal during the first period.

16. The organic light emitting display as claimed in claim 15, wherein the voltage of the off-power source is set to be substantially equal to a voltage of the first power source, and wherein the voltage of the reference power source is set to be in the voltage range of the data signals.

17. The organic light emitting display as claimed in claim 10, wherein the control driver supplies the first control after the third period in the one frame signal and then supplies the second control signal.

18. The organic light emitting display as claimed in claim 10, wherein the scan driver progressively stops the supply of the scan signals to the scan lines during the third period.

* * * * *